United States Patent
Toskala et al.

(10) Patent No.: US 6,904,077 B2
(45) Date of Patent: Jun. 7, 2005

(54) METHOD AND ARRANGEMENT FOR IMPLEMENTING INTRA-FRAME INTERLEAVING

(75) Inventors: Antti Toskala, Helsinki (FI); Mirko Aksentijevic, Espoo (FI)

(73) Assignee: Nokia Mobile Phones Ltd., Espoo (FI)

( * ) Notice: Subject to any disclaimer, the term of this patent is extended or adjusted under 35 U.S.C. 154(b) by 652 days.

(21) Appl. No.: 09/726,079

(22) Filed: Nov. 29, 2000

(65) Prior Publication Data

US 2001/0053173 A1 Dec. 20, 2001

(30) Foreign Application Priority Data

Nov. 30, 1999 (FI) .............................................. 19992561

(51) Int. Cl.[7] .......................... H04B 15/00; H04K 1/00; H04L 27/30
(52) U.S. Cl. ....................... 375/130; 375/140; 375/146; 375/265; 714/701; 714/756
(58) Field of Search ................................ 375/262, 265, 375/278, 284–285, 340–341, 140, 130, 141, 146; 714/755–756, 776, 762, 790, 701

(56) References Cited

U.S. PATENT DOCUMENTS

| 4,547,887 | A | | 10/1985 | Mui ............................... 375/1 |
| 5,056,112 | A | * | 10/1991 | Wei ............................. 375/280 |
| 5,602,875 | A | * | 2/1997 | Mantel et al. ............... 375/264 |
| 5,677,911 | A | * | 10/1997 | Fimoff et al. ................ 714/701 |
| 5,796,755 | A | | 8/1998 | Shon .......................... 371/39.1 |
| 6,259,744 | B1 | * | 7/2001 | Lee et al. .................... 375/264 |
| 6,311,306 | B1 | * | 10/2001 | White et al. ................ 714/790 |

FOREIGN PATENT DOCUMENTS

| EP | 0952673 A1 | 10/1999 |
| EP | 1045521 A2 | 10/2000 |
| EP | 1045522 A1 | 10/2000 |
| WO | WO 98/11671 | 3/1998 |
| WO | WO 98/43373 | 10/1998 |
| WO | WO 98/59473 | 12/1998 |
| WO | WO 00/49780 | 8/2000 |

OTHER PUBLICATIONS

Technical Specification TS 25.212, V3.0.0 (Oct. 1999).
"Performance Analysis of CDMA Transmit Diversity Methods", Jalloul et al., Vehicular Technology Conference, 1999, VTC 1 IEEE VTS 50th, vol. 3, pp. 1326–1330.

* cited by examiner

Primary Examiner—Phuong Phu
(74) Attorney, Agent, or Firm—Perman & Green, LLP.

(57) ABSTRACT

A method and radio device are provided for interleaving a stream of data (201) including digital information symbols prior to transmission over a radio interface. A permutation is performed (202, 203, 401, 402) to the steam of digital data, thus producing a permutated stream of digital data (204). From the permutated stream of digital data there are provided at least two component streams (404) for mapping each component stream into a spreading code (406). The order of information symbols is reversed (405) in at least one component stream prior to mapping it into a spreading code.

6 Claims, 5 Drawing Sheets

METHOD AND ARRANGEMENT FOR IMPLEMENTING INTRA-FRAME INTERLEAVING

TECHNOLOGICAL FIELD

The invention concerns generally the technology of interleaving transmission symbols in a radio transceiver in time domain. Especially the invention concerns the technology of implementing intra-frame interleaving in multicode transceivers of the proposed UTRA (Universal Terrestrial Radio Access) system.

BACKGROUND OF THE INVENTION

The Layer 1 multiplexing and channel coding characteristics of the FDD (Frequency Division Duplex) mode of the UTRA are, at the priority date of this patent application, defined in the document "TS 25.212 V3.0.0 (1999-10), 3rd Generation Partnership Project (3GPP); Technical Specification Group (TSG) Radio Access Network (RAN); Working Group 1 (WG1); Multiplexing and channel coding (FDD)" available through the 3GPP. FIG. 1 illustrates the transport channel multiplexing structure for uplink as defined in said document. The functional blocks the serial connection of which is shown in the upper part of FIG. 1 are CRC attachment 101, transport block concatenation and code block segmentation 102, channel coding 103, radio frame equalisation 104, first interleaving 105, radio frame segmentation 106 and rate matching 107. Several entities of the above-described kind may be coupled to the inputs of a transport channel multiplexing stage 108, the output of which is further coupled to the serial connection of physical channel segmentation 109, second interleaving 110 and physical channel mapping 111.

In the downlink direction there may be certain modifications to the arrangement of functional blocks shown in FIG. 1, but at least the lower end of the arrangement which consists of the physical channel segmentation, second interleaving and physical channel mapping entities remains the same. For the purposes of the present invention it suffices to analyze the operation of the second interleaving and physical channel mapping blocks.

The aim of the second interleaving 110 is to permutate the bits in time domain so that bits that originally were close to each other in the bit stream to be transmitted are separated from each other in the time domain for the duration of their travel over the radio interface. This way a short interval of extremely bad interference conditions at the radio interface should not cause any bursts of several consecutive erroneous bits in the received and decoded bit stream. The second interleaving 110 takes place in inter-frame manner meaning that the data entity subjected to interleaving is one radio frame.

FIG. 2 illustrates the operation of the second interleaving stage. The bits that come as an input stream 201 to the interleaver are written into a bit array 202 which has a certain number of rows and a certain number of columns. The numbers shown in the input stream and the bit array are simply the serial numbers of the bits in the radio frame. Here the number of columns is shown to be 32, with column numbers ranging from 0 to 31. The columns are fed into an intercolumn permutator 203 which rearranges them into a different order. As examples, the 0th column remains 0th, the 17th column comes 1st, the 14th column comes 30th and the 31th column remains 31th after the intercolumn permutator 203. The bits are read from the permutated columns to the output of the second interleaving stage column by column. The bit stream 204 with the serial number of certain bits is shown as the output of the second interleaving stage.

The TDD or Time Division Duplex mode with its possibility of simultaneously using several spreading codes brings about some complications to the presented arrangement. If a single spreading code is used to transmit the bit stream, the bit stream 204 is transmitted by using that spreading code. However, in a multicode situation the transmitting device has at least two spreading codes at its disposal, and it transmits by using these parallel spreading codes simultaneously during a single time slot. The presently defined physical channel mapping arrangement is such that the parallel spreading codes are filled one at a time with bits taken from the bit stream 204. This may lead to the situation shown at the bottom of FIG. 2 where, during a certain time slot, e.g. bits 0 and 14, bits 32 and 46 and so on of a certain frame are transmitted simultaneously. Currently the number of parallel spreading codes may vary between 2 and 9.

The arrangement according to FIG. 2 has the drawback of in the multicode situation canceling much of the advantages usually obtained through the second interleaving, because certain bits that are near to each other in the frame are practically not separated at all in the time domain at the radio interface. The nature of the interference occurring in UTRA systems is such that it may occur e.g. that a part of a time slot either from the very beginning or from the very end of the time slot gets erased due to interference, especially inter-operator interference. The result of such an erasure, taken the arrangement of FIG. 2, is a burst of errors very close to each other in a received frame.

SUMMARY OF THE INVENTION

It is an object of the present invention to provide a method and an arrangement for ensuring that the separation in time between adjacent bits in a frame does not suffer in a multicode transmission arrangement. It is a further object of the invention that major changes in the existing proposed arrangements could be avoided.

The objects of the invention are achieved by modifying the order in which the bits are mapped into the spreading codes after the second interleaving stage.

The method according to the invention is meant for interleaving a stream of data consisting of digital information symbols prior to transmission over a radio interface. It comprises the steps of performing a permutation to the stream of digital data, thus producing a permutated stream of digital data, producing, from the permutated stream of digital data, at least two component streams mapping each component stream into a spreading code.

It is characterized in that it comprises the step of reversing the order of information symbols in at least one component stream prior to mapping it into a spreading code.

The invention also applies to a transmitter arrangement which comprises means for performing a permutation to the stream of digital data, thus producing a permutated stream of digital data, means for producing, from the permutated stream of digital data, at least two component streams means for mapping each component stream into a spreading code.

It is characteristic to the radio device that it comprises means for reversing the order of information symbols in at least one component stream prior to mapping it into a spreading code.

The present invention is based on a finding that the mapping of bits into the parallel spreading codes has a key role in maintaining the separation of bits in the time domain. An advantageous way to eliminate the drawbacks of the existing arrangements is to modify the order in which the bits are mapped at least to a part of the spreading codes.

In order not to cause major changes into the existing proposed arrangement it was found that if in every second one of the component bit streams that are parts of the output of the second interleaver the order of bits is inverted, sufficient separation in time domain between bits is maintained. Such a modification contains essentially no added complexity, because the order in which a certain finite bit stream is read (from first bit to last bit or from last bit to first bit) is merely a question of choosing a certain memory access command properly.

The invention requires only a minor change in the existing proposed arrangements, and yet it provides a significant relief to the problem of maintaining sufficient separation in time domain between bits that are close to each other in the frame.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIGS. 1 and 2 were already accounted for in the description of prior art. Like parts in the drawings are shown with the same reference designators.

DETAILED DESCRIPTION OF THE INVENTION

Figure 2:
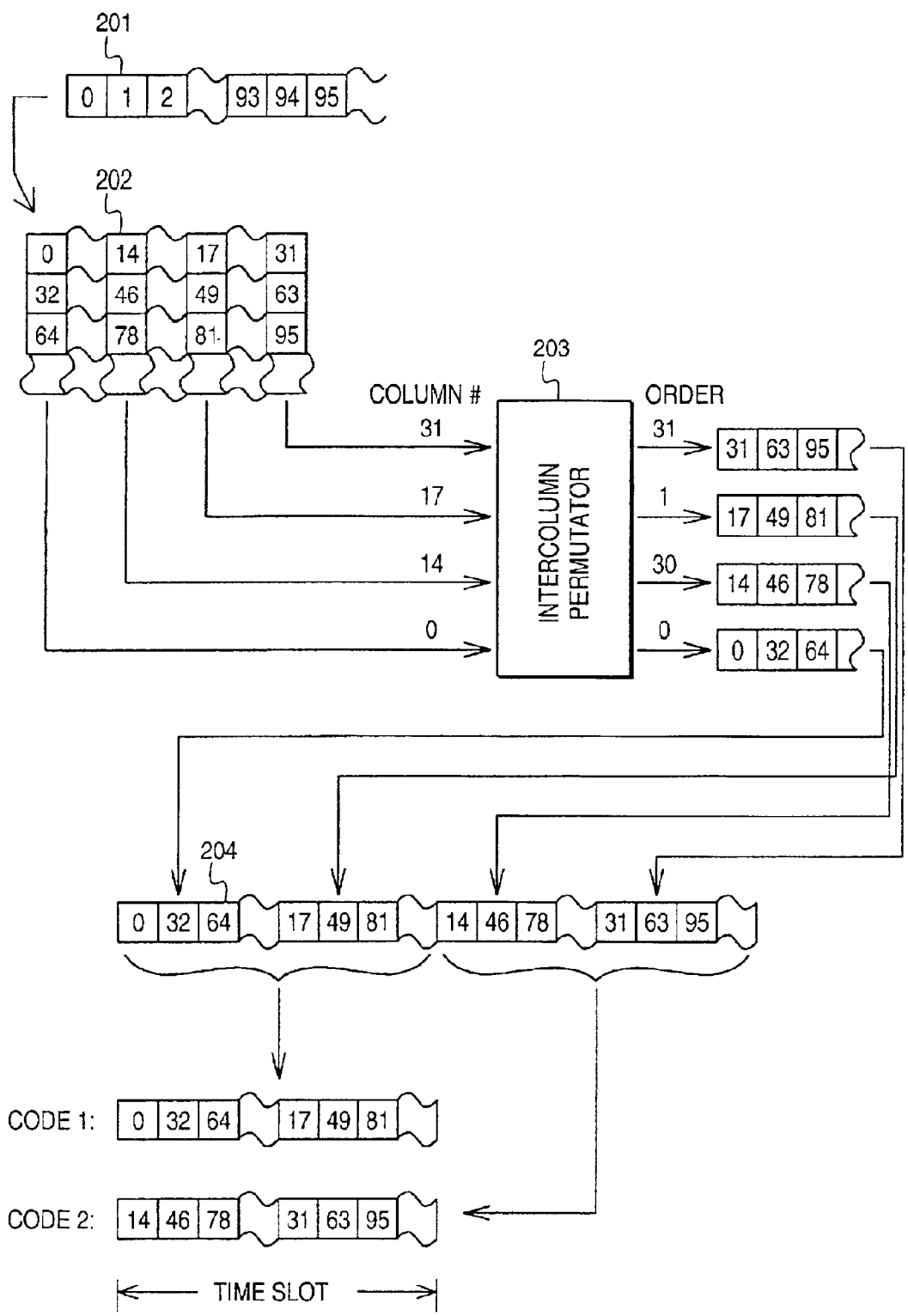
FIG. 2 illustrates the results of second interleaving and code mapping in the arrangement of FIG. 1.
Figure 3:
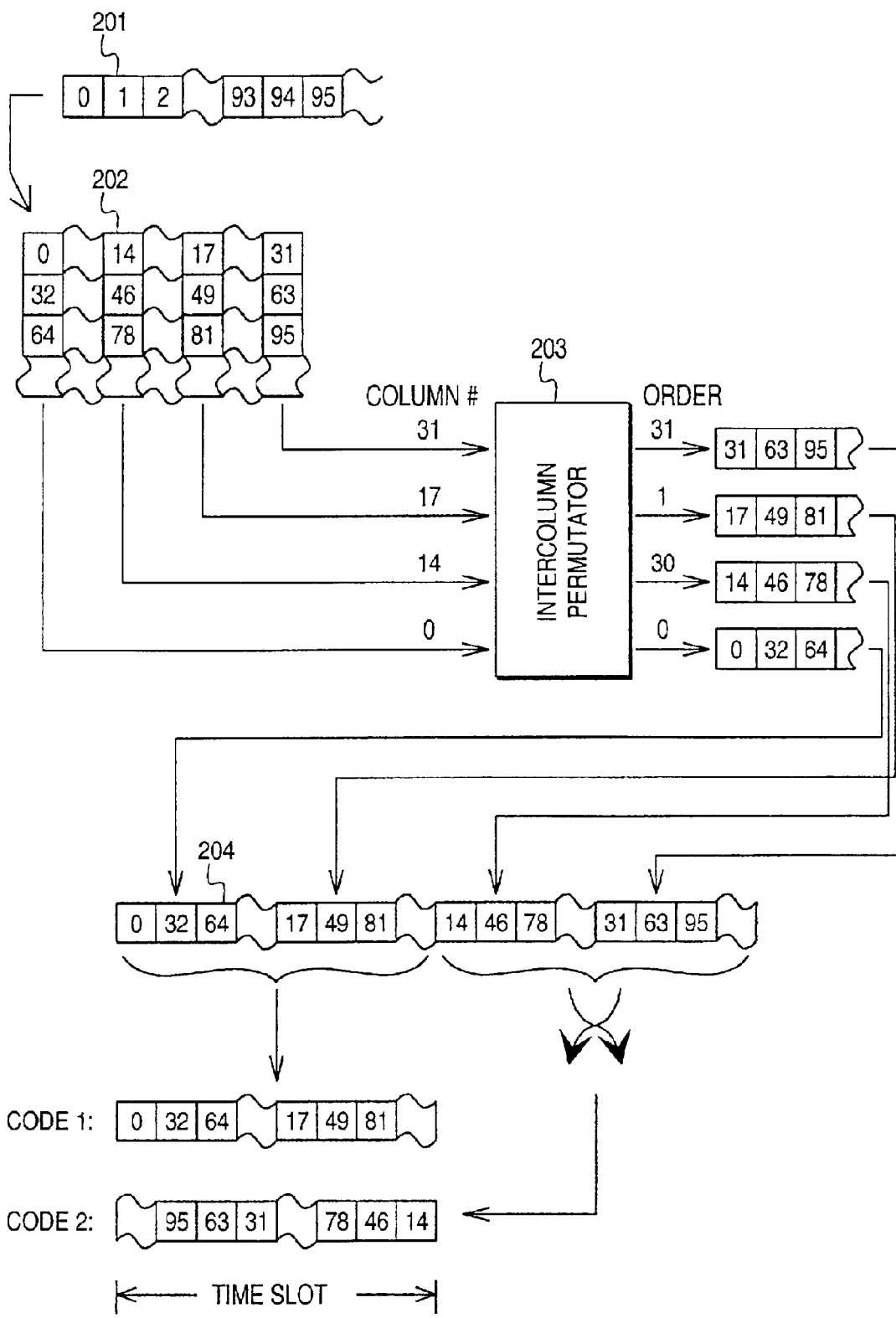
FIG. 3 illustrates the results of second interleaving and code mapping according to an advantageous embodiment of the invention.

The upper part of FIG. 3 is similar to that of FIG. 2: The bits that come as an input stream 201 to a second interleaver are written into a bit array 202 which has a certain number of rows and a certain number of columns. Here the number of columns is again 32, with column numbers ranging from 0 to 31. The columns are fed into an intercolumn permutator 203 which rearranges them into a different order. The present invention does not change the operation of the intercolumn permutator, so the 0th column remains 0th, the 17th column comes 1st, the 14th column comes 30th and the 31th column remains 31th after the intercolumn permutator 203 just as in the prior art arrangement of FIG. 2.

The invention pertains to the order in which the bits are read from the permutated columns to the output of the second interleaving stage, which is also the input of the physical channel mapping stage. The bit stream 204 with the serial number of certain bits is shown as the known output form of the second interleaving stage. However, when the bits are mapped therefrom to the parallel spreading codes of which there are two in FIG. 3, the order of bits in the component bit stream that goes into the second spreading code is reversed.

The principle shown in FIG. 3 is easily generalized to the case of N parallel spreading codes, where N is a positive integer greater than 2, by stating that the bit order in every second component bit stream is reversed before mapping that component bit stream into the corresponding spreading code.

The invention does not limit the choice of the actual physical step in which the inverting of bit order is made for every second component bit stream. The system specifications of communications systems like the UTRA do not usually specify any particular hardware implementation for performing the standardized operations, but these are left into the discretion of transceiver designers. One advantageous way to perform the reversing is to integrate it into the step in which the bits are read from the bit array 202 after column permutation: the step of permutating columns does not mean anything else than correctly selecting the order in which bits are read from the memory locations where they are stored when they are said to be in the bit array. The transceiver may reorganize this reading order that in addition to the permutated order of columns, it takes into account the fact that those columns that go to the bit streams destined to be reversed are read in an inverted order and from bottom to top in the array representation.

Figure 1:
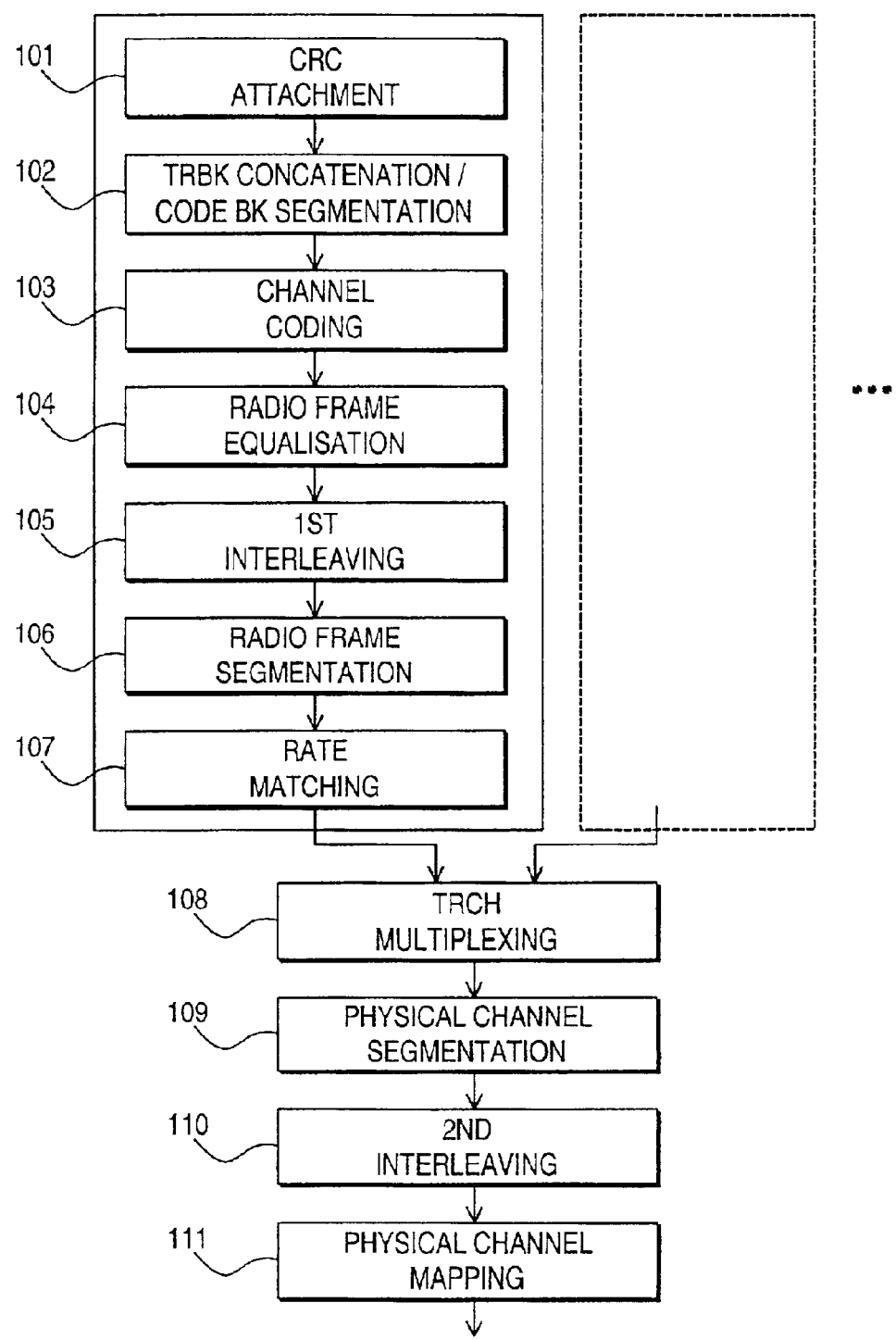
FIG. 1 illustrates a known transport channel multiplexing structure for uplink.
Figure 4:
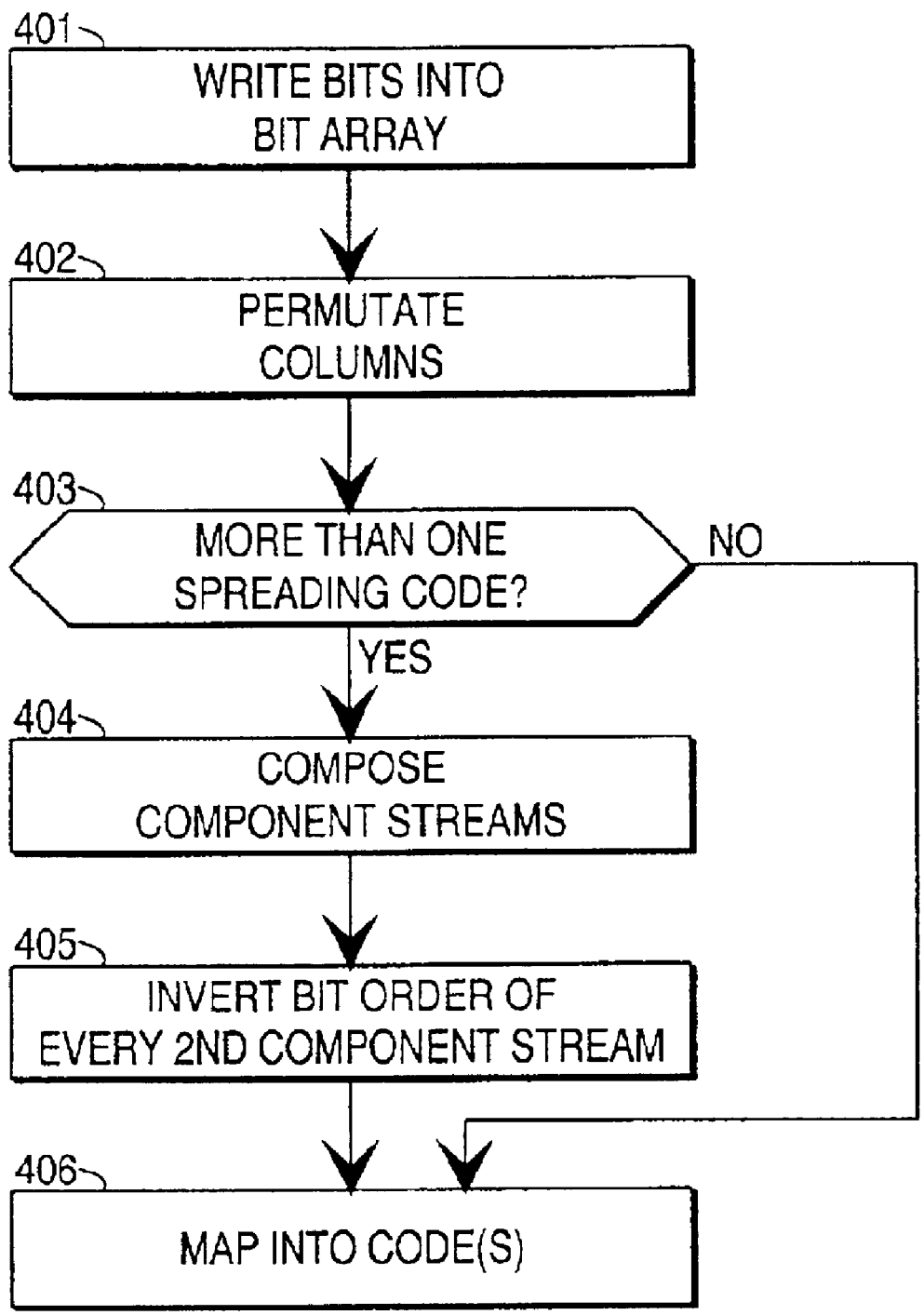
FIG. 4 is a flow diagram of the method according to the invention and FIG. 5 illustrates a radio device according to an embodiment of the invention.

FIG. 4 illustrates a method according to an advantageous embodiment of the invention in the form of a flow diagram. The steps shown in FIG. 4 belong functionally to the second interleaving stage 110 shown in FIG. 1. Step 401 corresponds to writing the input bits into a bit array, and step 402 corresponds to permutating the columns. At step 403 the transceiver checks the number of spreading codes it has at its disposal for transmitting this particular frame. If the number of codes is only one, the permutated columns are output in the known order so that they can be correctly mapped into the spreading code at step 406. If, however, there is a positive finding at step 403, component streams are (at least conceptually) composed at step 404 and in every second one of these the bit order is reversed at step 405.

Figure 5:
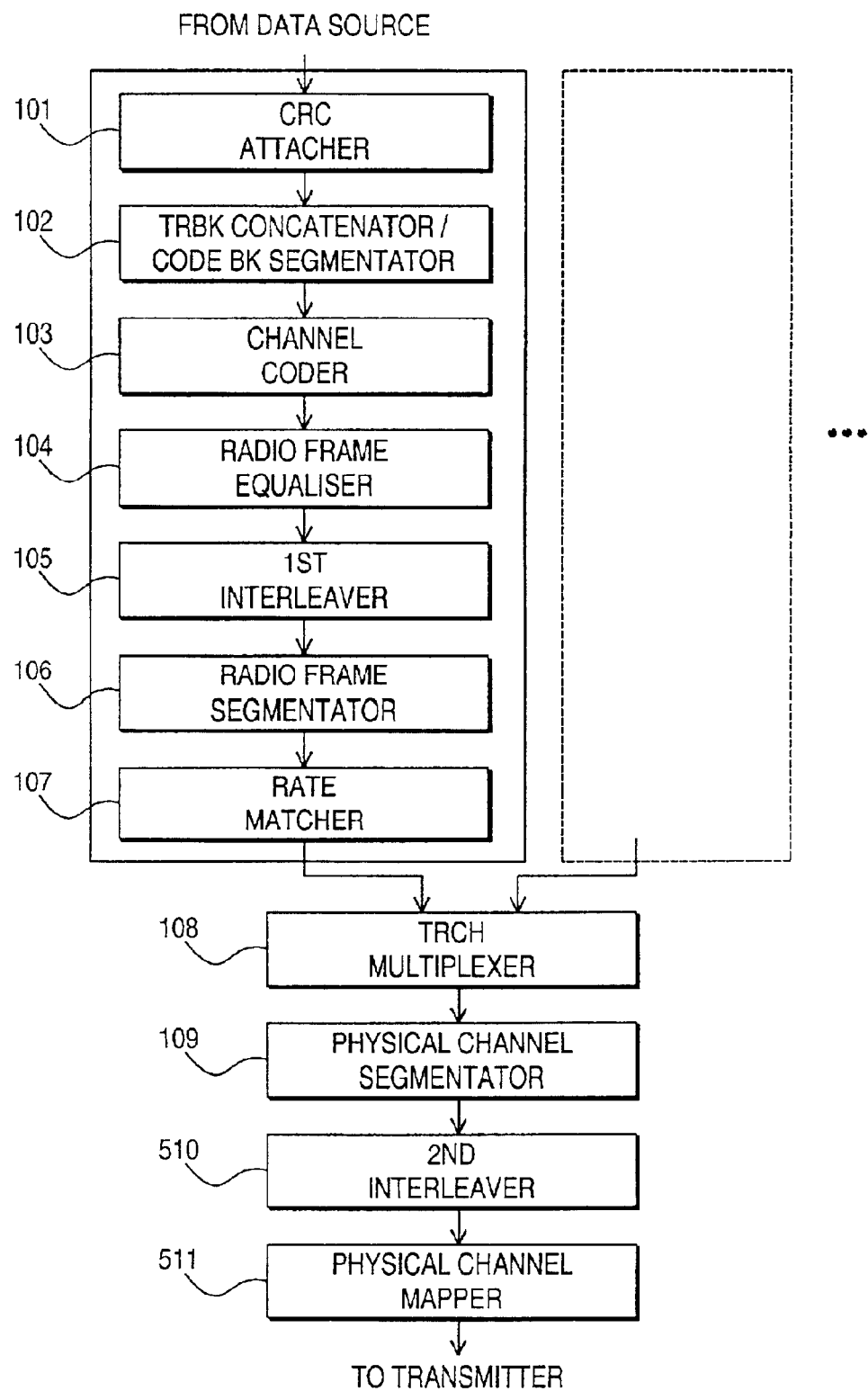

FIG. 5 illustrates the structure of a mobile terminal or base station where the parts from the CRC attacher 101 to the physical channel segmentator 109 may be similar as in known devices that conform to the TS 25.212 document mentioned in the description of prior art. The second interleaver 510 and the physical channel mapper 511 together are arranged to implement the method illustrated in FIG. 4; the physical implementation of the method is straightforward and within the capabilities of a person skilled in the art on the basis of the above-given instructions.

In one embodiment, the radio device comprises means for interleaving a stream of data having digital information symbols prior to transmission over a radio interface, that includes means for performing a permutation to the stream of digital data, thus producing a permutated stream of digital data, means for producing, from the permutated stream of digital data, at least two component streams, means for reversing the order of information symbol in at least one component stream and means for mapping each component stream into a spreading code.

In one embodiment, the radio device is a mobile terminal of a 3GPP radio communication system. In another embodiment, the radio device is a base station of a 3GPP radio communication system.

The above-given exemplary embodiments should not be construed as limiting the applicability of the invention; the latter is merely reflected in the scope of the appended claims. For example the invention does not require that an interleaving operation where every second component stream to be mapped into a spreading code should be limited to interleaving within a single time slot. Similarly the permutation and order inverting operations may be performed on groups of bits (e.g. so that three consecutive bits constitute a group) instead of just bits.

What is claimed is:

1. A method for interleaving a stream of data consisting of digital information symbols:

performing a permutation to the stream of digital data, thus producing a permutated stream of digital data, producing, from the permutated stream of digital data, at least two component streams, reversing the order of information symbols in at least one component stream and mapping each component stream into a spreading code used for spread spectrum transmission over a radio interface.

2. A method according to claim 1, comprising the step of reversing the order of information symbols in every second component stream prior to mapping these component streams into their corresponding spreading codes.

3. A method according to claim 1, wherein the step of performing a permutation to the stream of digital data comprises the steps of writing the information symbols of a certain passage of the stream of data into a permutation matrix and reading the information symbols from the columns of said permutation matrix in a column order which is different than the order of continuous columns in said permutation matrix;

so that the steps of producing at leant two component streams and reversing the order of information symbols in at least one component stream are performed on a discrete sequence of information symbol obtained as a result of said reading of the information symbols from the columns of said permutation matrix.

4. A radio device comprising means for interleaving a stream of data consisting of digital information symbols prior to transmission over a radio interface, comprising:

a permutator adapted to perform a permutation to the stream of digital data, thus producing a permutated stream of digital data, a component stream producer adapted to produce, from the permutated stream of digital data, at least two component streams, symbols order reverser adapted to reverse the order of information symbol in at least one component stream and a mapper adapted to map each component stream into a spreading code used for spread spectrum transmission over a radio interface.

5. A radio device according to claim 4, the radio device being a mobile terminal of a 3GPP radio communication system.

6. A radio device according to claim 4, the radio device being a base station of a 3GPP radio communication system.

* * * * *